US012622216B2

(12) United States Patent
Takeda et al.

(10) Patent No.: US 12,622,216 B2
(45) Date of Patent: May 5, 2026

(54) WAFER HAND, SEMICONDUCTOR MANUFACTURING APPARATUS, AND METHOD FOR MANUFACTURING SEMICONDUCTOR DEVICE

(71) Applicant: Mitsubishi Electric Corporation, Tokyo (JP)

(72) Inventors: Naoyuki Takeda, Tokyo (JP); Hiroshi Tanaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 1099 days.

(21) Appl. No.: 17/653,368

(22) Filed: Mar. 3, 2022

(65) Prior Publication Data
US 2022/0367222 A1 Nov. 17, 2022

(30) Foreign Application Priority Data
May 12, 2021 (JP) ................................. 2021-081049

(51) Int. Cl.
*H01L 21/677* (2006.01)
*H01L 21/683* (2006.01)
*H01L 21/687* (2006.01)

(52) U.S. Cl.
CPC .... *H01L 21/67742* (2013.01); *H01L 21/6838* (2013.01); *H01L 21/68707* (2013.01)

(58) Field of Classification Search
CPC ........... H01L 21/67742; H01L 21/6838; H01L 21/68707; H01L 21/6732; H01L 21/68785; H01L 21/673; H01L 21/677
See application file for complete search history.

(56) References Cited

U.S. PATENT DOCUMENTS

| | | | | |
|---|---|---|---|---|
| 9,425,076 | B2 * | 8/2016 | Agarwal | H01L 21/67766 |
| 2014/0110959 | A1 * | 4/2014 | Urabe | H01L 21/68707 |
| | | | | 901/31 |

(Continued)

FOREIGN PATENT DOCUMENTS

| | | |
|---|---|---|
| CN | 112530847 A | 3/2021 |
| JP | H11-071025 A | 3/1999 |

(Continued)

OTHER PUBLICATIONS

An Office Action; "Notice of Reasons for Refusal," mailed by the Japanese Patent Office on Mar. 12, 2024, which corresponds to Japanese Patent Application No. 2021-081049 and is related to U.S. Appl. No. 17/653,368; with English language translation.

(Continued)

*Primary Examiner* — Stephen A Vu
(74) *Attorney, Agent, or Firm* — Studebaker Brackett PLLC

(57) ABSTRACT

In a wafer hand, two carry portions are arranged in line in a first direction, the two carry portions are connected via a joint portion, each of the two carry portions extends from the joint portion in a second direction orthogonal to the first direction, an interval between inner side surfaces of the two carry portions is 170 mm or more, an interval between outer side surfaces of the two carry portions is 280 mm or less, and when a distance between inner side surfaces of the two carry portions is A (mm), and a length of the inner side surfaces of the two carry portions in the second direction is L (mm), a relationship of $L \geq (300^2 - A^2)^{0.5}$ is satisfied.

17 Claims, 17 Drawing Sheets

22

(56)          References Cited

U.S. PATENT DOCUMENTS

| | | | | |
|---|---|---|---|---|
| 2015/0279719 | A1* | 10/2015 | Nishida | ............ H01L 21/68728 |
| | | | | 294/86.4 |
| 2016/0005638 | A1* | 1/2016 | Agarwal | ........... H01L 21/68707 |
| | | | | 294/213 |
| 2017/0287759 | A1* | 10/2017 | Kanazawa | ........ H01L 21/67712 |
| 2021/0090918 | A1 | 3/2021 | Kuwahara | |

FOREIGN PATENT DOCUMENTS

| | | | |
|---|---|---|---|
| JP | 2001-102421 | A | 4/2001 |
| JP | 2006-179836 | A | 7/2006 |
| JP | 2007-274003 | A | 10/2007 |
| JP | 2013-151035 | A | 8/2013 |
| JP | 2014-207338 | A | 10/2014 |
| JP | 2021-048322 | A | 3/2021 |

OTHER PUBLICATIONS

An Office Action mailed by China National Intellectual Property Administration on Jan. 16, 2025, which corresponds to Chinese Patent Application No. 202210491103.7 and is related to U.S. Appl. No. 17/653,368; with English language translation.
An Office Action mailed by the Japanese Patent Office on Jul. 30, 2024, which corresponds to Japanese Patent Application No. 2021-081049 and is related to U.S. Appl. No. 17/653,368.

\* cited by examiner

F I G .  1
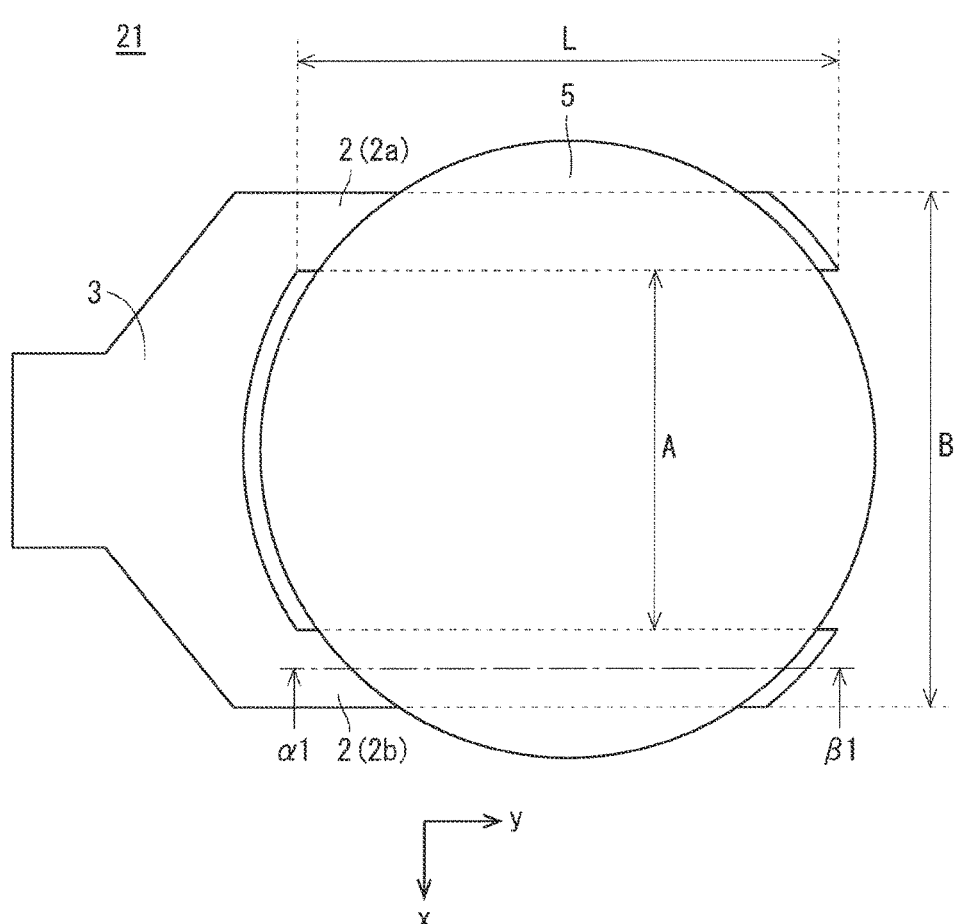

F I G.  2
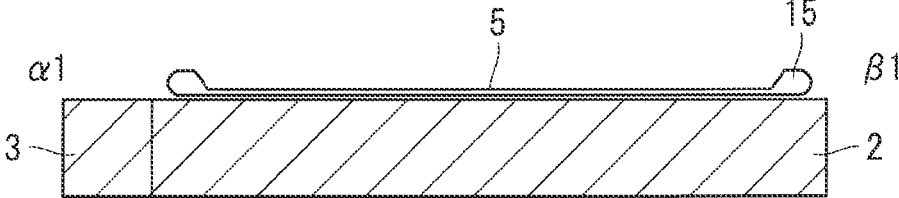

F I G. 3
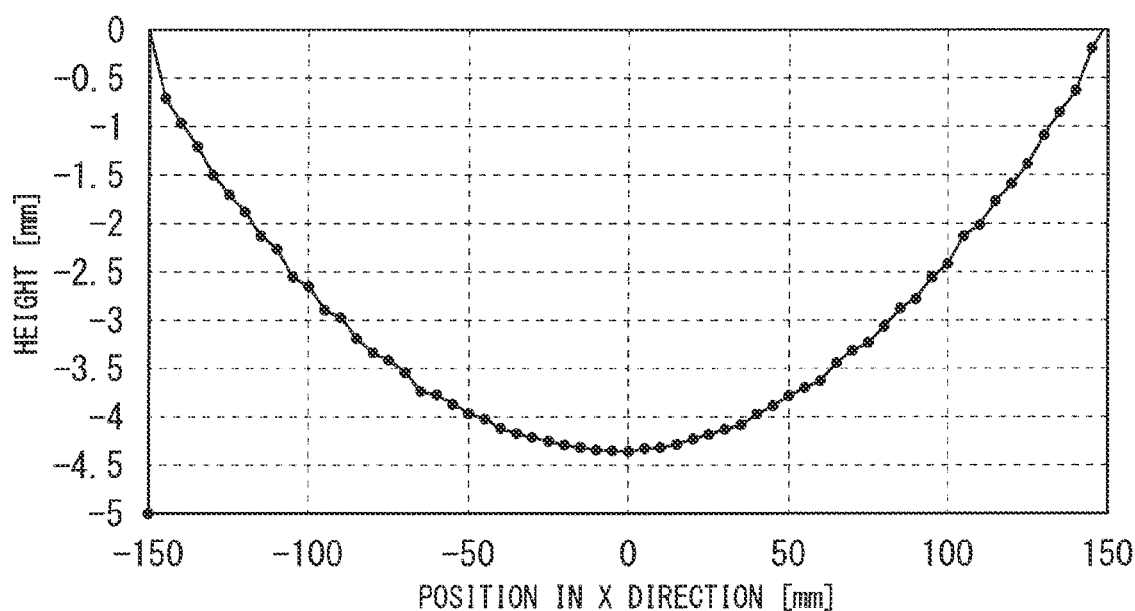

F I G. 4
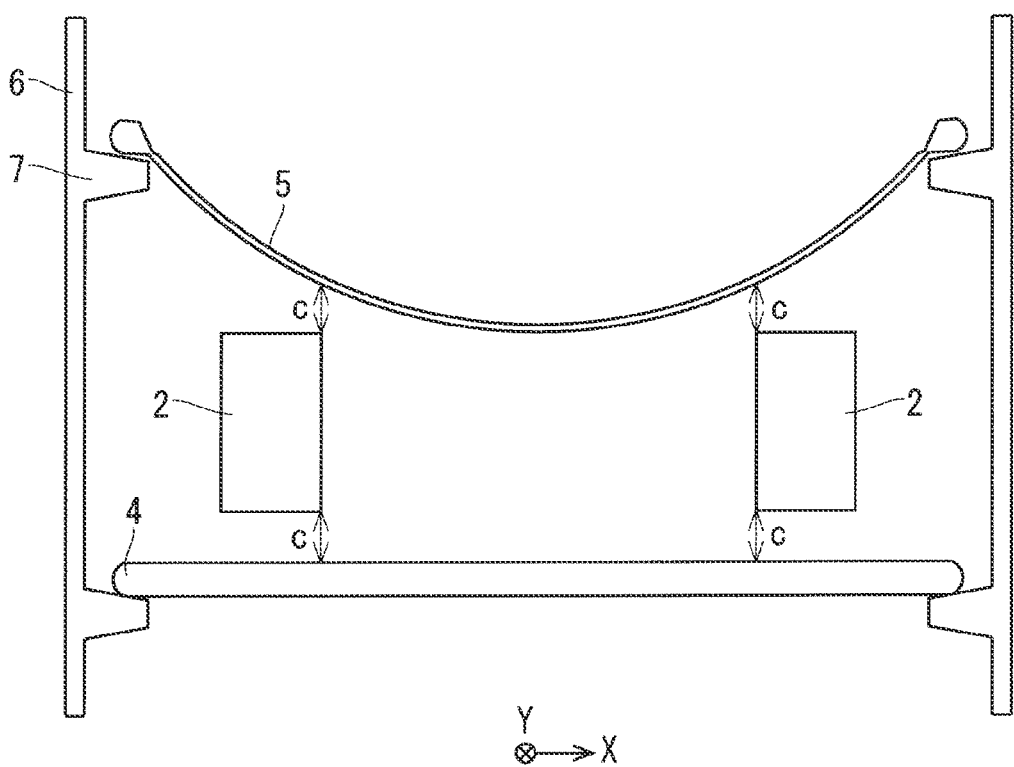

F I G.  5
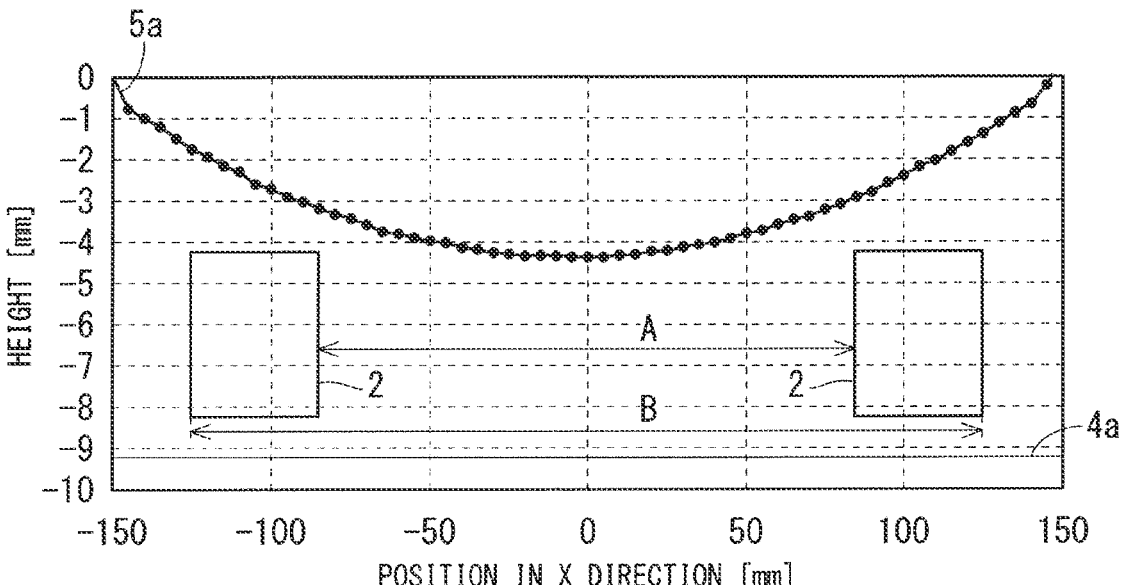

F I G.  7
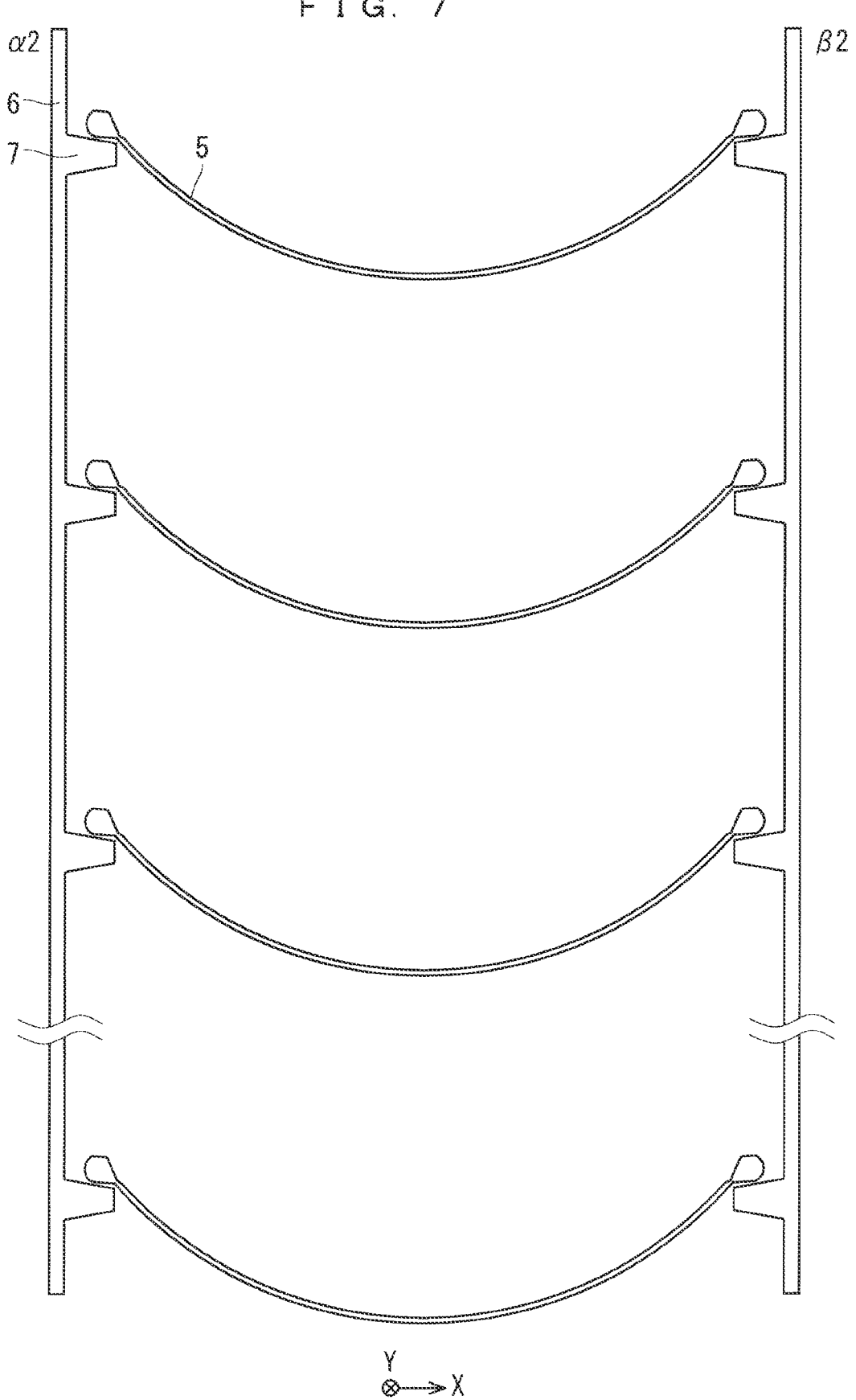

F I G .   8
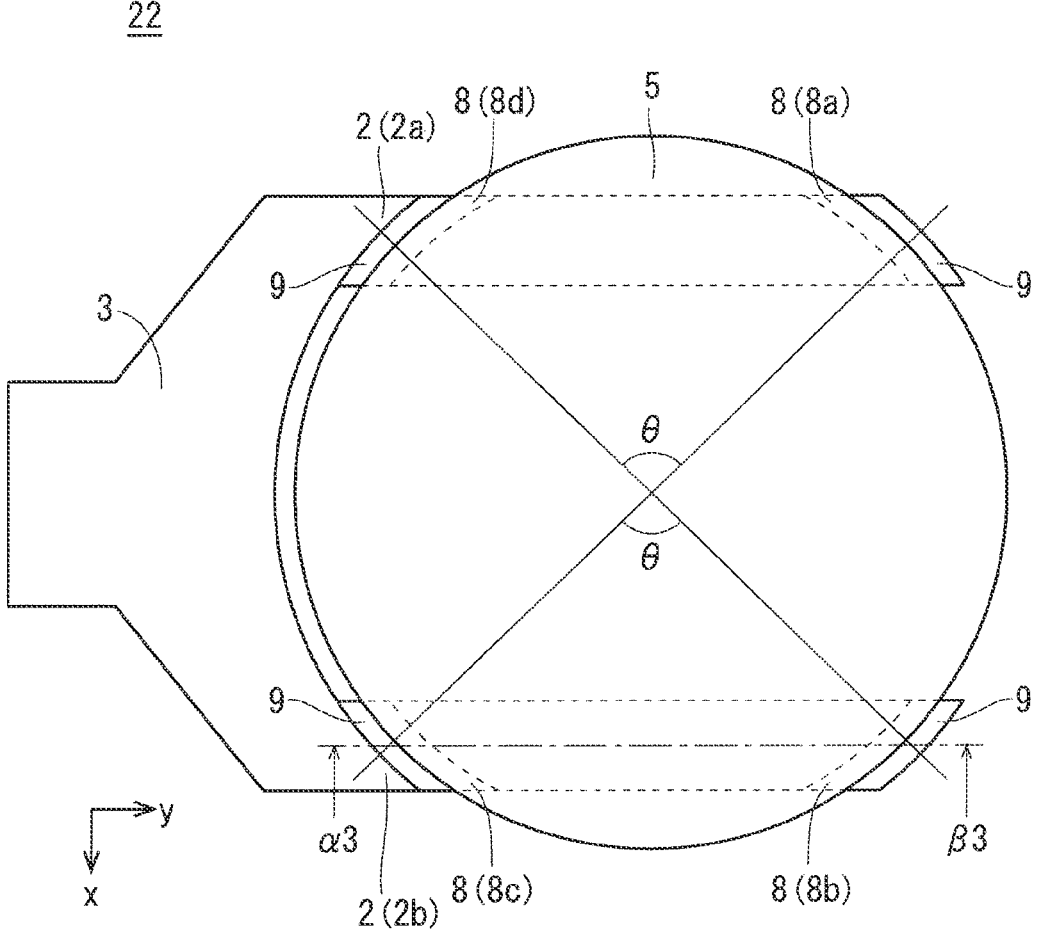

F I G.  9
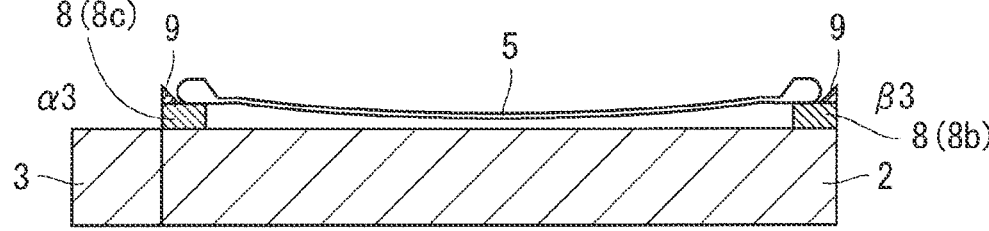

F I G. 1 O
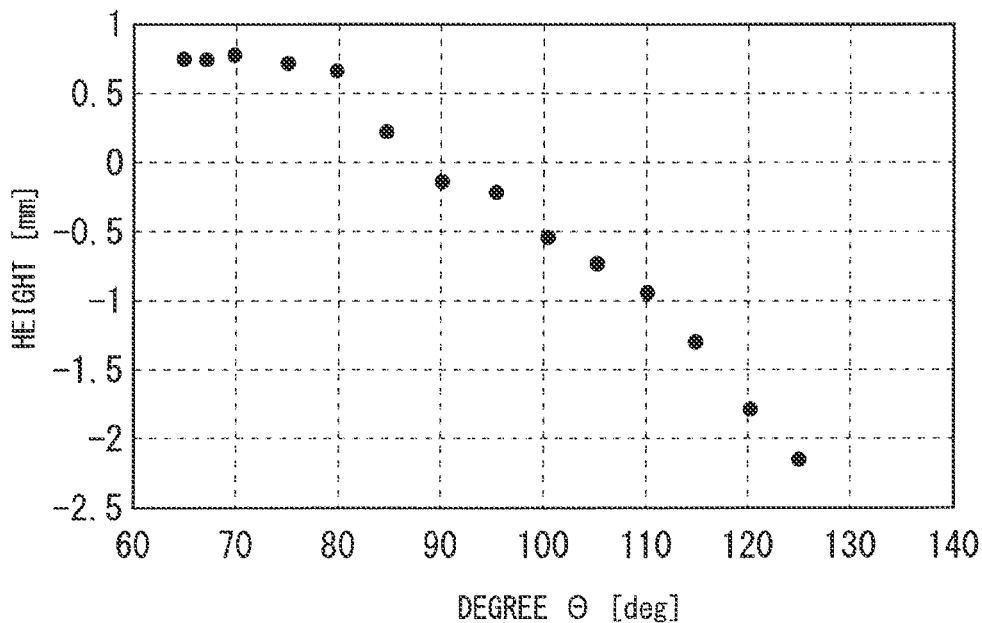

F I G. 1 1
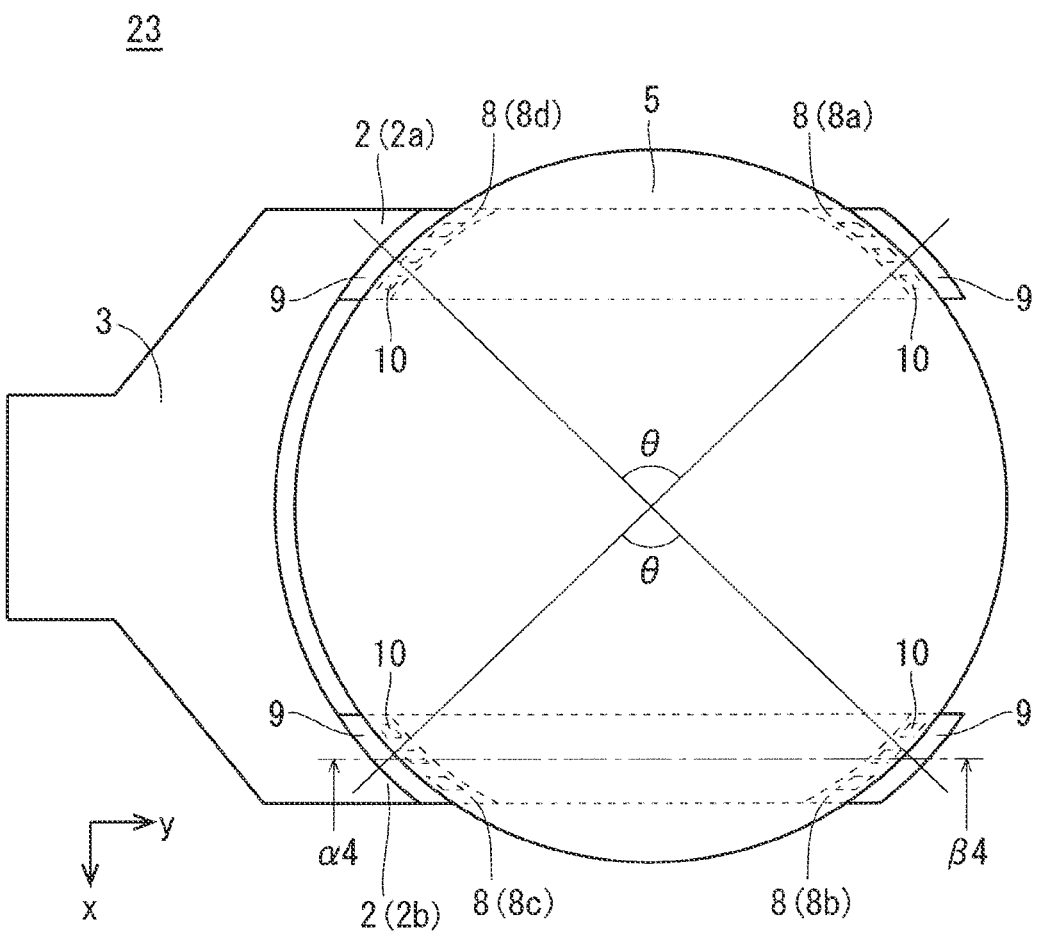

F I G. 1 2
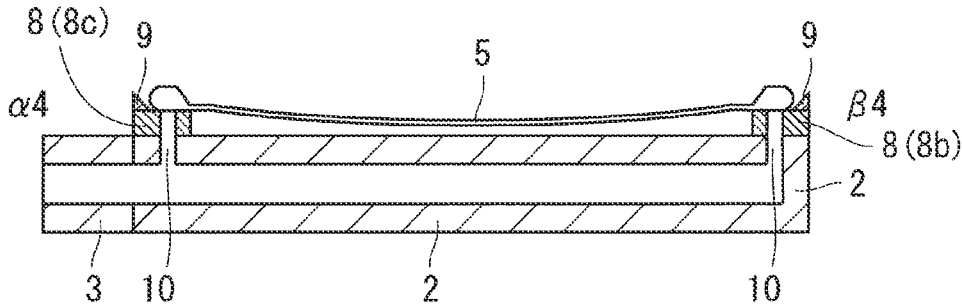

F I G.  1 3
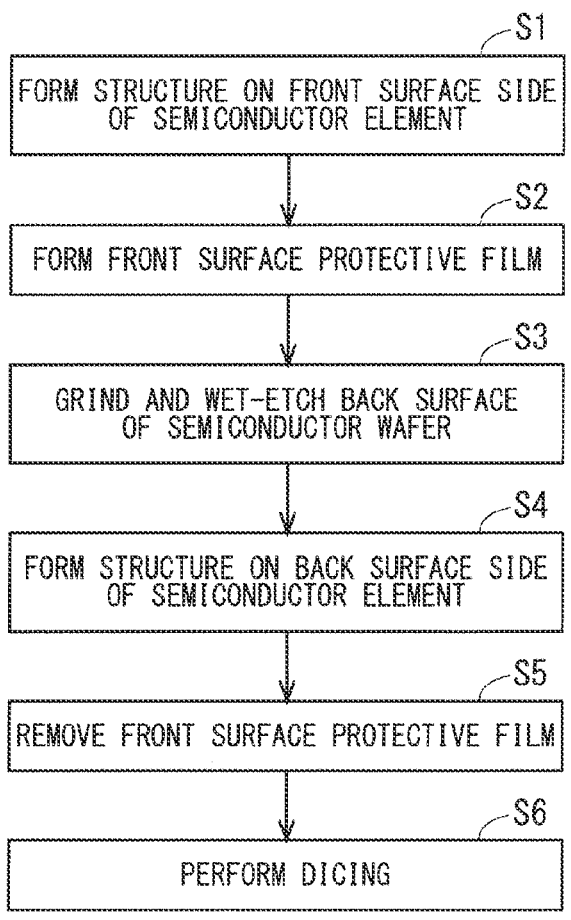

F I G .  1 4
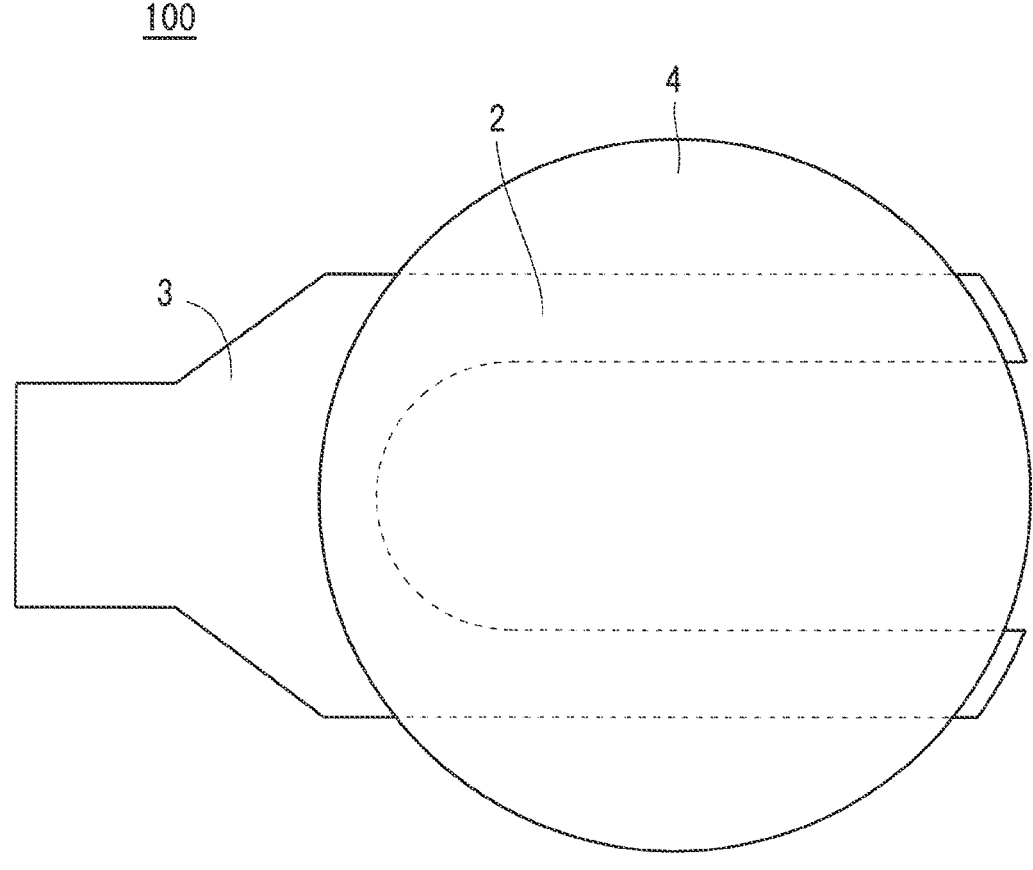

F I G.  1 5
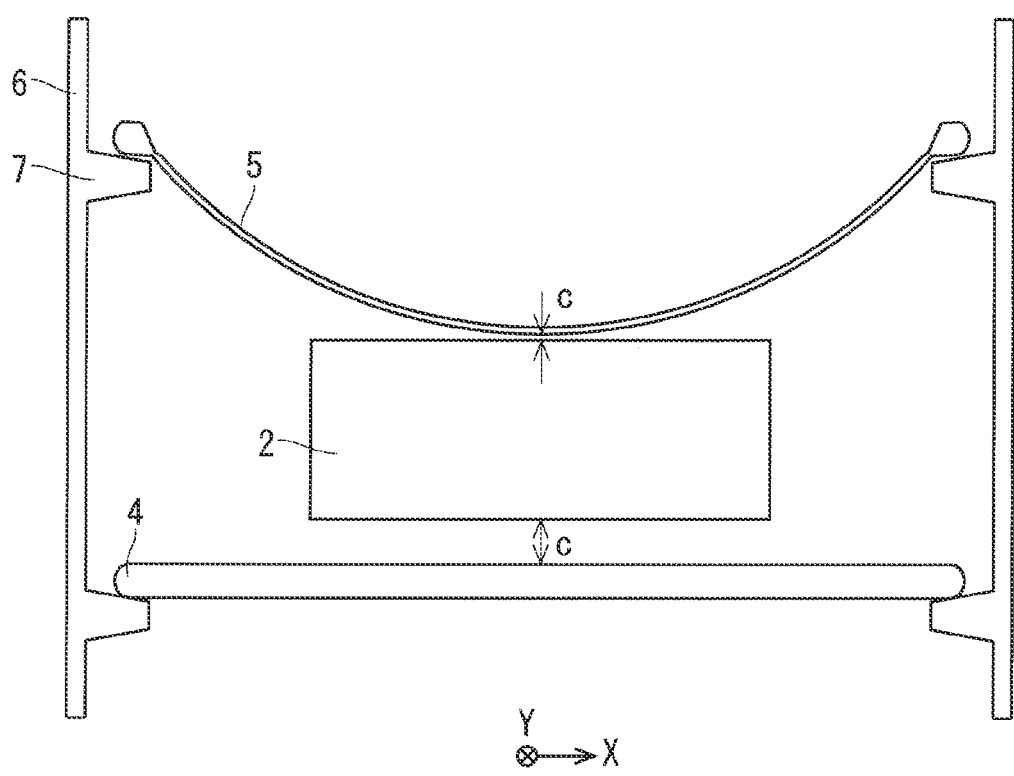

F I G. 1 6
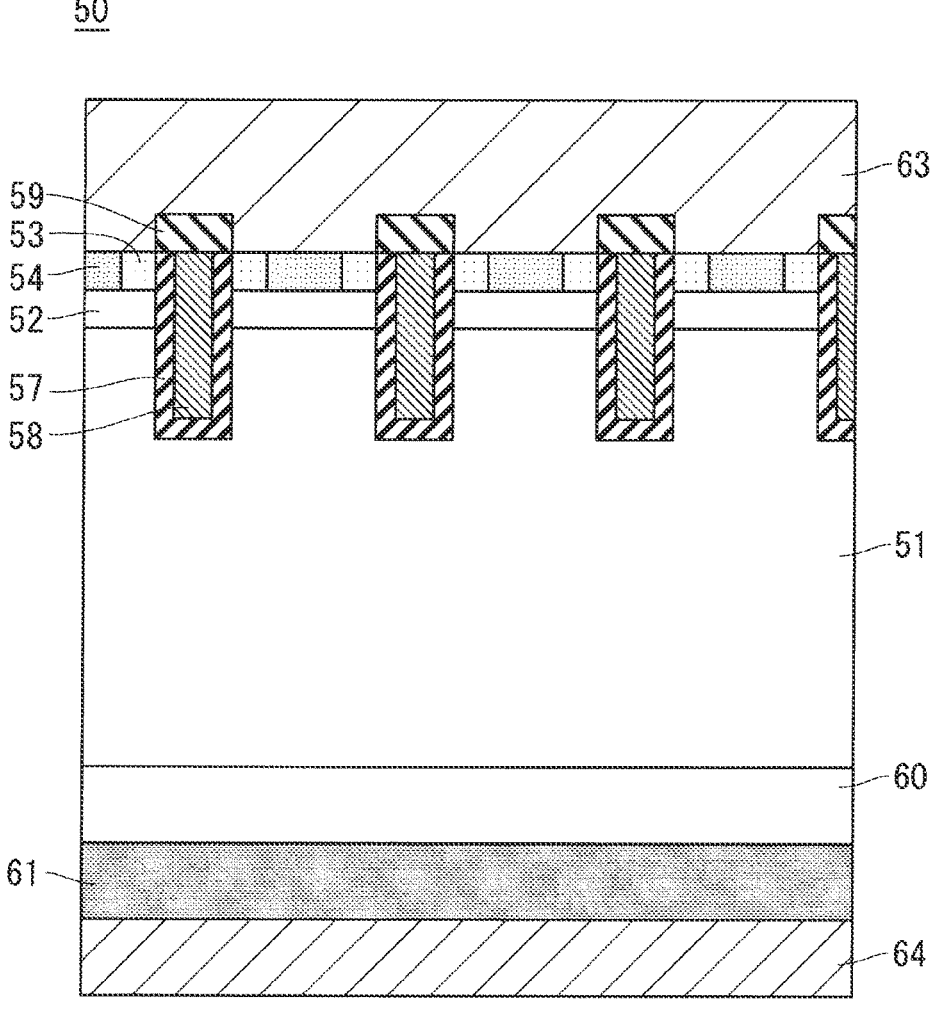

F I G.  1 7
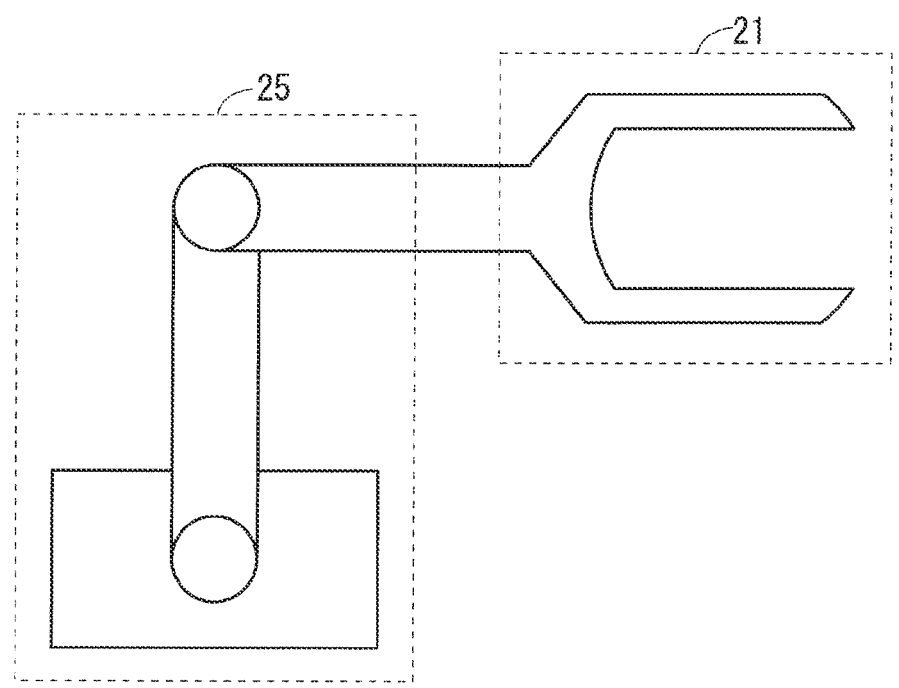

WAFER HAND, SEMICONDUCTOR MANUFACTURING APPARATUS, AND METHOD FOR MANUFACTURING SEMICONDUCTOR DEVICE

BACKGROUND OF THE INVENTION

Field of the Invention

The present disclosure relates to a wafer hand, a semi-conductor manufacturing apparatus, and a method for manu-facturing a semiconductor device.

Description of the Background Art

Wafer hands are used to transfer semiconductor wafers. A wafer hand is disclosed in, for example, Japanese Patent Application Laid-Open No. 2013-151035.

In a carrier for storing a semiconductor wafer, the semi-conductor wafer is stored by supporting the semiconductor wafer by each of a plurality of grooves formed in the vertical direction on both left and right inner walls. Because the semiconductor wafer stored in the carrier is supported only at the outer peripheral portion of the semiconductor wafer, a downward deflection occurs due to its own weight in an unsupported central portion. A large deflection occurs in a wafer having a thin wafer thickness such as a stepped wafer. To take out the semiconductor wafer stored in the carrier where multiple semiconductor wafers are stored, it is nec-essary to insert a wafer hand between the semiconductor wafers. However, when a gap for inserting the wafer hand becomes small due to the deflection of the semiconductor wafers, a problem occurs that the semiconductor wafers and the wafer hand comes into contact with each other at an unintended location.

SUMMARY

An object of the present disclosure is to provide a wafer hand capable of suppressing contact between a semiconduc-tor wafer and the wafer hand at an unintended location when the semiconductor wafer is taken in and out of a carrier.

A wafer hand according to a first aspect of the present disclosure includes two carry portions and a joint portion. The two carry portions are arranged in line in a first direction. The two carry portions are connected via the joint portion. Each of the two carry portions extends from the joint portion in a second direction orthogonal to the first direction. An interval between side surfaces of the two carry portions, the side surfaces facing a direction intersecting the second direction of each of the two carry portions and facing each other, is 170 mm or more. An interval between side surfaces of the two carry portions, the side surfaces facing the direction intersecting the second direction of each of the two carry portions and facing opposite sides to each other, is 280 mm or less. When a distance between inner side surfaces of the two carry portions is A (mm) and a length of the inner side surfaces of the two carry portions in the second direction is L (mm), a relationship of $L \geq (300^2 - A^2)^{0.5}$ is satisfied.

The present disclosure provides a wafer hand capable of suppressing contact between a semiconductor wafer and the wafer hand at an unintended location when the semiconduc-tor wafer is taken in and out of a carrier.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 1 is a plan view of a wafer hand of a first preferred embodiment;

FIG. 2 is a cross-sectional view taken along the line $\alpha 1$-$\beta 1$ in FIG. 1;

FIG. 3 is a diagram showing a deflection of a stepped wafer stored in a carrier;

FIG. 4 is a diagram showing a state in which the wafer hand of the first preferred embodiment is inserted between the wafers stored in the carrier;

FIG. 5 is a diagram showing the deflection of the stepped wafer stored in the carrier;

FIG. 7 is a cross-sectional view taken along the line $\alpha 2$-$\beta 2$ in FIG. 6;

FIG. 8 is a plan view of an example of a wafer hand according to a second preferred embodiment;

FIG. 9 is a cross-sectional view taken along the line $\alpha 3$-$\beta 3$ in FIG. 8;

FIG. 10 is a diagram showing the relationship between a position of a placement portion and a deflection of a stepped wafer;

FIG. 11 is a plan view of another example of the wafer hand according to the second preferred embodiment;

FIG. 12 is a cross-sectional view taken along the line $\alpha 4$-$\beta 4$ in FIG. 11;

FIG. 13 is a flowchart showing a manufacturing method of a semiconductor device according to a third preferred embodiment;

FIG. 14 is a plan view of a wafer hand of a comparative example;

FIG. 15 is a diagram showing a state in which the wafer hand of the comparative example is inserted between wafers stored in a carrier;

FIG. 16 is a diagram showing a semiconductor device manufactured according to the third preferred embodiment; and FIG. 17 is a diagram showing a semiconductor manufac-turing apparatus according to the first preferred embodi-ment.

DESCRIPTION OF THE PREFERRED EMBODIMENTS

A. First Preferred Embodiment

A-1. Configuration

Figure 6:
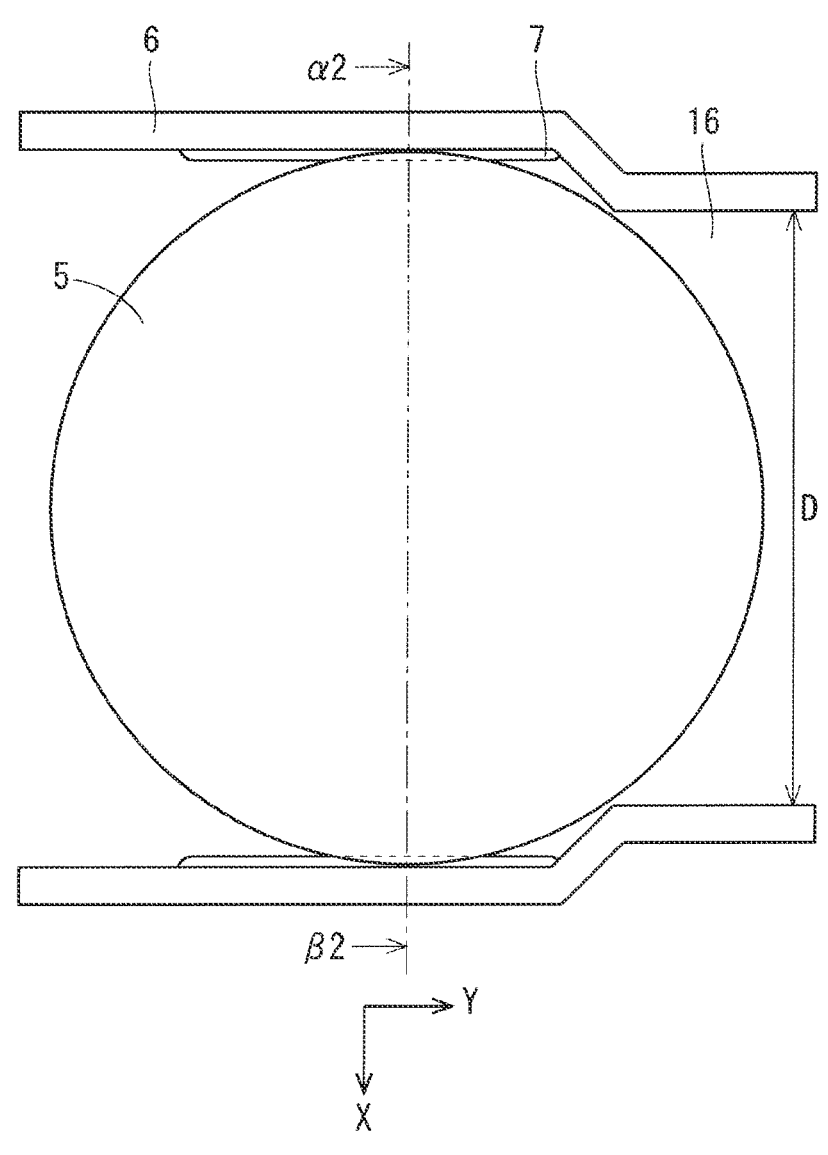
FIG. 6 is a diagram showing a state in which the wafer is stored in the carrier.

FIG. 1 is a plan view showing a wafer hand 21 of the present preferred embodiment. FIG. 2 is a cross-sectional view of the wafer hand 21 taken along the $\alpha 1$-$\beta 1$ line in FIG. 1. FIGS. 1 and 2 also show a stepped wafer 5 placed on the wafer hand 21. The stepped wafer 5 has a rim 15 on an outer peripheral portion. The thickness of the stepped wafer 5 is thinner at the central portion than at the rim 15.

The wafer hand 21 includes two carry portions 2 (2a, 2b) and a joint portion 3. The two carry portions 2 are arranged in line in the first direction (x direction in FIG. 1). The two carry portions 2 extend from the joint portion 3 in the second direction (y direction in FIG. 1). The two carry portions 2 are connected via the joint portion 3. The first direction and the second direction are orthogonal directions.

Hereinafter, for each of the two carry portions 2, "inner side" means the side facing the other carry portion 2. That is, the inner side surface of the carry portion 2a is a side surface on the carry portion 2b side, and the inner side surface of the carry portion 2b is a side surface on the carry portion 2a side.

Each of the two carry portions 2 has an inner side surface extending linearly in the second direction in a plan view. In addition, each of the two carry portions 2 has an outer side surface extending linearly in the second direction in a plan view.

The wafer hand 21 is, for example, a wafer hand used for carrying a 300 mm wafer having a step.

An interval A between the inner side surfaces of the two carry portions 2 is 170 mm or more.

An interval B between the outer side surfaces of the two carry portions 2 is 250 mm or less.

Each of the two carry portions 2 may be shorter on the outer side of the carry portion 2 than on the inner side of the carry portion 2. That is, the end portion of the inner side surface on the second direction side may be located on the second direction side of the end portion on the second direction side of the outer side surface. The outer side of the carry portion 2 being shorter than the inner side of the carry portion 2 allows the rigidity of the carry portion 2 to increase. The tips of the two carry portions 2 each have an arc shape along the outer circumference of the stepped wafer 5 placed on the wafer hand 21, for example.

When the interval between the inner side surfaces of the two carry portions 2 is A (mm) and the length of the inner side surfaces of the two carry portions 2 in the second direction is L (mm), A and L are designed such that the relationship of $L \geq (300^2 - A^2)^{0.5}$ is satisfied. Here, $(300^2 - A^2)^{0.5}$ is the length of the portion where the inner side surface of the carry portion 2 overlaps with the stepped wafer 5 in a plan view when the diameter of the stepped wafer 5 is 300 mm. As a result, when the stepped wafer 5 is placed on the two carry portions 2 in a state where the stepped wafer 5 does not overlap with the end portion of the inner side surface of the two carry portions 2 on the joint portion 3 side, each of the two carry portions 2 can reach the second direction side of the side surface on the second direction side of the stepped wafer 5. Therefore, at a position in the first direction in which the carry portion 2 exists, the carry portion 2 can be firmly inserted in such a manner as to support the stepped wafer 5 over the entire second direction.

For example when the interval A (mm) is 170 mm or more and less than 200 mm assuming a 300 mm wafer having a step, L may be 247 mm or more. For example when the interval A (mm) is 200 mm or more and 230 mm or less, L may be 223 mm or more.

The portion of the side surface of the joint portion 3 on the second direction side between the two carry portions 2 is concaved in such a manner as to be located closer to the side opposite to the second direction in the central portion between the two carry portions 2 in a plan view. As a result, even when the stepped wafer 5 is placed on the carry portion 2 such that the side surface of the stepped wafer 5 on the side opposite to the second direction is located near the boundary between the carry portion 2 and the joint portion 3, the joint portion 3 and the stepped wafer 5 do not overlap in a plan view.

Next, a carrier for storing a wafer will be described. FIG. 6 is a plan view showing a state in which the stepped wafer 5 is stored in a carrier 6. FIG. 7 is a cross-sectional view taken along the line α2-β2 in FIG. 6.

The carrier 6 is a carrier compatible with 300 mm wafers and conforms to the Semi standard.

The carrier 6 is provided with a support portion 7. The support portion 7 is a protrusion protruding from the side surface of the carrier 6. The protruding length of the support portion 7 is, for example, less than 10 mm.

The stepped wafer 5 is stored in the carrier 6 in a state where the back surface is supported by the support portions 7 at both end portions in the X direction.

FIG. 3 is a diagram showing how the stepped wafer 5 deflects in a state where the stepped wafer 5 is supported by the support portion 7 of the carrier 6 at the back surface at both end portions in the X direction as shown in FIGS. 6 and 7.

In FIG. 3, the lowest value of the height at each position in the X direction is plotted with respect to the height at the support portion 7. The lowest value of the height at a certain position in the X direction is the height at the lowest position among the different positions in the Y direction specified by the position in the X direction.

In FIG. 3, data is shown with the height of the portion where the stepped wafer 5 is supported by the support portion 7 as 0 (mm).

As shown in FIG. 3, the stepped wafer 5 deflects in such a manner as to be high in the vicinity of the support portion 7, that is, in the region where the value on the horizontal axis is close to −150 mm or 150 mm, and low in the central portion in the X direction, that is, in the region where the value on the horizontal axis is near 0 mm.

FIG. 4 is a diagram showing a state where the stepped wafer 5 to which the measurement of FIG. 3 is performed is stored in a stage of the carrier 6, and a semiconductor wafer 4 is stored in a stage one level below the stage in which the stepped wafer 5 is stored. The semiconductor wafer 4 is a wafer whose central portion is not thinned. FIG. 4 also shows the carry portion 2 of the wafer hand 21 inserted between the semiconductor wafer 4 and the stepped wafer 5.

In FIG. 5, 5a represents the height of the lower surface of the stepped wafer 5. 4a represents the height of the upper surface of the semiconductor wafer 4. Because the semiconductor wafer 4 is not thinned, the height of the upper surface of the semiconductor wafer 4 is almost constant regardless of the position in the plane.

When the stepped wafer 5 is stored in the upper stage of the vertically adjacent stages and the unthinned semiconductor wafer 4 is stored in the lower stage, a clearance decreases when the wafer hand 21 is inserted between the wafer stored in the upper stage and wafer stored in the lower stage.

The support portion 7 is arranged in the height direction with intervals of about 10 mm. Due to the deflection of the stepped wafer 5, the interval between the lower surface of the stepped wafer 5 and the upper surface of the semiconductor wafer 4 is about 5 mm in the central portion in the X direction.

When the wafer hand 21 having 170 mm or more of the interval A is used and the carry portion 2 is inserted between the stepped wafer 5 and the semiconductor wafer 4 as shown in FIGS. 4 and 5, the interval between the lower surface of the stepped wafer 5 and the upper surface of the semiconductor wafer 4 is about 6 mm or more at the position in the X direction where the carry portion 2 is inserted. As a result, a larger clearance C between the carry portion 2 and the stepped wafer 5 or a larger clearance C between the carry portion 2 and the semiconductor wafer 4 can be secured. For example, when the thickness of the carry portion 2 is 4 mm, the clearance C between the carry portion 2 and the stepped wafer 5 or the clearance C between the carry portion 2 and the semiconductor wafer 4 can be secured by at least about 1 mm each, at the entire position in Y direction where the carry portion 2 exists. As a result, it is possible to suppress contact between the wafer hand 21 and the semiconductor wafer 4 or the stepped wafer 5 at an unintended location.

The interval B is for example 280 mm or less when the protruding length of one support portion 7 is for example less than 10 mm, so that the stepped wafer 5 can be placed on the wafer hand 21 without contacting the support portion 7 when the wafer hand 21 is lifted from the state shown in FIG. 4.

Also, as shown in FIG. 6, the carrier 6 is formed narrower on the side opposite to the side where the wafer hand 21 is inserted (that is, the Y direction side in FIG. 6) than the side where the wafer hand 21 is inserted, to hold the end portion of the wafer. A width D of an opening 16 of the narrowed portion is 250 mm. When the interval B is 250 mm or less, the wafer hand 21 is inserted up to the narrowed portion, and the stepped wafer 5 can also be supported by the wafer hand 21 at the end portion of the stepped wafer 5 opposite to the side where the wafer hand 21 is inserted.

Next, a semiconductor manufacturing apparatus including a wafer hand will be described. FIG. 17 is a diagram showing a semiconductor manufacturing apparatus 200, which is an example of the semiconductor manufacturing apparatus of the present preferred embodiment. The semiconductor manufacturing apparatus 200 is an apparatus for carrying wafers. The semiconductor manufacturing apparatus 200 includes the wafer hand 21. The semiconductor manufacturing apparatus 200 includes, for example, a drive unit 25 for driving the wafer hand 21, and the drive unit 25 drives the wafer hand 21 to automatically carrying the wafer. The semiconductor manufacturing apparatus of the present preferred embodiment may be any semiconductor manufacturing apparatus including the wafer hand 21, and the semiconductor manufacturing apparatus of this preferred embodiment may be a semiconductor manufacturing apparatus other than the semiconductor manufacturing apparatus 200 shown in FIG. 17.

A-2. Operation

A method of taking out the stepped wafer 5 by using the wafer hand 21 from the state where a plurality of the stepped wafers 5 are stored in the carrier 6 will be described. The stepped wafer 5 to be taken out is called a stepped wafer 5a, and the stepped wafer 5 stored in a stage one level below the stepped wafer 5a is called a stepped wafer 5b.

When the stepped wafer 5 is taken out from the carrier 6, the two carry portions 2 of the wafer hand 21 are inserted between the stepped wafer 5a to be taken out and the stepped wafer 5b which is located one level below the stepped wafer 5a.

At this time, the two carry portions 2 are inserted into the carrier 6 from the minus Y direction side to the Y direction side in FIG. 6 in such a manner as not to overlap with the central portion of the stepped wafer 5 in the X direction in a plan view. The two carry portions 2 are inserted into regions where the amount of deflection shown in FIG. 3 is small, that is, regions where the X coordinate is −125 mm to −85 mm or 85 mm to 125 mm. One carry portion 2 is inserted into the region where the X coordinate is −125 mm to −85 mm, and the other carry portion 2 is inserted into the region where the X coordinate is 85 mm to 125 mm.

The two carry portions 2 are inserted into the carrier 6 such that they do not overlap with the central portion of the stepped wafer 5 in the X direction in a plan view, and therefore it becomes easy to insert the two carry portions 2 between the stepped wafer 5a to be taken out and the stepped wafer 5b located one level below the stepped wafer 5a.

As shown in FIG. 4, the wafer hand 21 is designed as described above such that the wafer hand 21 can be inserted while securing a sufficient clearance even in a situation where the stepped wafer 5 is located on the upper stage and the non-stepped semiconductor wafer 4 is located on the lower stage, that is, in a situation where the gap for inserting the wafer hand 21 is smallest. Therefore, it is not necessary to adjust the position of the wafer hand 21 when inserting the wafer hand 21 according to the configuration of the wafer stored in the carrier 6. By not adjusting the position, it is possible to prevent a malfunction due to an error in setting the position for inserting the wafer hand 21. As a result, production efficiency improves, and the wafer can be prevented from being damaged due to a setting error.

After the wafer hand 21 is inserted, the wafer hand 21 is raised until the stepped wafer 5a and the two carry portions 2 come into contact with each other, so that the stepped wafer 5a is held only by the two carry portions 2 and not held by the support portion 7. At this time, because the two carry portions 2 hold up to the wafer end portion in the direction opposite to the insertion side of the wafer hand 21, the deflection at the wafer end portion in the direction opposite to the insertion side of the stepped wafer 5a held by the two carry portions 2 becomes small.

Next, the wafer hand 21 is slightly raised to the extent that it does not come into contact with the stepped wafer 5 stored in the upper stage of the stepped wafer 5a.

Next, the wafer hand 21 holding the stepped wafer 5a is drawn out from the carrier 6. The stepped wafer 5a drawn out from the carrier 6 is then carried by the wafer hand 21 to, for example, a processing stage of an apparatus for processing the stepped wafer 5a.

Next, an operation of carrying the stepped wafer 5 from the processing stage or the like to the carrier 6 and storing the stepped wafer 5 in the carrier 6 will be described.

First, the wafer hand 21 is positioned in the downward direction of the stepped wafer 5 (hereinafter referred to as a stepped wafer 5c) for which processing has been completed.

Next, the wafer hand 21 is raised and the stepped wafer 5c and the two carry portions 2 are brought into contact with each other, so that the stepped wafer 5c reaches a state of being held only by the two carry portions 2 and not held by the processing stage.

Next, the wafer hand 21 is moved from the processing stage to the vicinity of the carrier 6. Next, the wafer hand 21 is positioned in the upward direction of the support portion 7 at a storing target position of the carrier 6. Next, the wafer hand 21 is inserted at the position where the wafer center, which is the most deflecting portion, of the stepped wafer 5 stored in the upper stage of the stage where the stepped wafer 5c is to be stored does not come into contact with the stepped wafer 5c held by the wafer hand 21. After that, the wafer hand 21 is lowered to bring the stepped wafer 5c into contact with the support portion 7, so that the stepped wafer 5c reaches a state of being held only by the support portion 7 and not held by the two carry portions 2. After that, the wafer hand 21 is pulled out from the carrier 6 to complete the storage.

A-3. Modification Example

It has been described that in the wafer hand 21, each of the two carry portions 2 has an inner side surface extending linearly in the second direction in a plan view, but each of the two carry portions 2 may have a more common shape. Although the shape of the wafer hand 21 has been described assuming a 300 mm wafer, a wafer of a different size may also be assumed. A wafer hand similar to the wafer hand 21 is useful because a large-sized wafer has a large deflection when stored in the carrier.

That is, the wafer hand 21 may be, for example, a wafer hand on which a disk-shaped object having a diameter of d (mm) can be placed in such a manner as to satisfy the following conditions (a) and (b).

By the wafer hand 21 satisfying the condition (a), as shown in FIG. 1, the stepped wafer 5 can be placed while avoiding the central portion of the stepped wafer 5 in the x direction. In addition, by the wafer hand 21 satisfying the condition (a), the wafer hand 21 does not get caught in the support portion 7 when the stepped wafer 5 is taken out from the carrier 6 by the wafer hand 21. Further, by the wafer hand 21 satisfying the condition (b), the carry portion 2 can support the stepped wafer 5 over the entire Y direction.

The wafer hand 21 may be, for example, a wafer hand on which a disk-shaped object having a diameter of d (mm) can be placed in such a manner as to satisfy the following conditions (a), (b), and (c).

By satisfying the condition (c), the tip of the wafer hand 21 can be inserted into the opening 16 where the carrier 6 is narrowed as shown in FIG. 6.

In addition, the wafer hand 21 may be, for example, a wafer hand on which a disk-shaped object having a diameter of d (mm) can be placed in such a manner as to satisfy the following conditions (d) and (e).

By satisfying the conditions (d) and (e), the same advantages as when the conditions (a), (b) and (c) are satisfied can be obtained.

(a) The object does not overlap with the two carry portions 2 or the joint portion 3 in a plan view in a region other than a region where the distance from the center of the object is 85×(d/300) mm or more and 140×(d/300) mm or less with respect to the x direction.

(b) In each of the two regions where the distance from the center of the object is 85×(d/300) mm or more and 140×(d/300) mm or less with respect to the x direction, one of the two carry portions 2 extends to the y direction side of the side surface on the y direction side of the object.

(c) A portion of each of the two carry portions 2 on the y direction side of the side surface on the y direction side of the object falls within a region where the distance from the center of the object is 85×(d/300) mm or more and 125×(d/300) mm or less with respect to the x direction.

(d) The object does not overlap with the two carry portions 2 or the joint portion 3 in a plan view in a region other than a region where the distance from the center of the object is 85×(d/300) mm or more and 125×(d/300) mm or less with respect to the x direction.

(e) In each of the two regions where the distance from the center of the object is 85×(d/300) mm or more and 125×(d/300) mm or less with respect to the x direction, one of the two carry portions 2 extends to the y direction side of the side surface on the y direction side of the object.

The diameter d of the disk-shaped object may be, for example, 295 mm or more. Specifically, the diameter d of the disk-shaped object may be, for example, 300 mm or 450 mm.

B. Second Preferred Embodiment

A wafer hand 22 of the present preferred embodiment shown in FIG. 8 is different from the wafer hand 21 of the first preferred embodiment in that it includes a placement portion 8 and a guide 9. The wafer hand 22 is otherwise the same as the wafer hand 21. Note that FIG. 9 is a cross-sectional view taken along the line α3-β3 in FIG. 8.

In the wafer hand 22, the placement portion 8 and the guide 9 are provided at two locations, one on one end portion on the y direction side and one on the other end portion on the opposite side to the y direction side, in each of the two carry portions 2.

Only one of the placement portion 8 and the guide 9 may be provided on the wafer hand 22.

By restricting the position in an in-plane direction of the stepped wafer 5 by the guide 9, the misalignment of the stepped wafer 5 from the proper position is suppressed.

Each placement portion 8 is for placing a wafer on the upper surface, and the upper surface of each placement portion 8 is not tilted. The tilt of the upper surface of each placement portion 8 is, for example, less than 3°. The tilt of the upper surface of each placement portion 8 is, for example, less than 1°. A wafer is placed on the two carry portions 2 via each placement portion 8.

By the placement portion 8 being provided, it is desirable that the stepped wafer 5 can be held by the wafer hand 22 in a state where the wafer hand 22 is in contact with only the outer peripheral portion of the stepped wafer 5, as shown in FIGS. 8 and 9. This allows the contact area between the wafer hand 22 and the stepped wafer 5 to be reduced.

In FIG. 10, when the stepped wafer 5 is convex downward on the α3-β3 line, the height of the lowest position of the lower surface of the stepped wafer 5 is plotted on the α3-β3 line. When the stepped wafer 5 is convex upward on the α3-β3 line, the height of the highest position on the lower surface of the stepped wafer 5 is plotted on the α3-β3 line. In FIG. 10, the height of the upper surface of the placement portion 8 is 0 mm.

Data in FIG. 10 is obtained by measuring the height of the stepped wafer 5 on the α3-β3 line with a sufficiently high placement portion and with the stepped wafer 5 and the wafer hand 22 not being in contact with each other.

A degree Θ regarding the arrangement of the placement portion 8 is a degree of an angle opening in the first direction side out of the angles formed by a straight line connecting the center of a placement portion 8*d* (for example, the center in the circumferential direction of the stepped wafer 5, hereinafter referred to as the center in the circumferential direction) and the center in the circumferential direction of a placement portion 8*b* and a straight line connecting the center in the circumferential direction of a placement portion 8*a* and the center in the circumferential direction of a placement portion 8*c* in a plan view.

The placement portion 8*a* is the placement portion 8 at the end portion of the carry portion 2*a* on the y direction side. The placement portion 8*b* is the placement portion 8 at the end portion of the carry portion 2*b* on the y direction side. The placement portion 8*c* is the placement portion 8 at the end portion of the carry portion 2*b* on the side opposite to the y direction side. The placement portion 8*d* is the placement portion 8 at the end portion of the carry portion 2*a* on the side opposite to the y direction side.

As shown in FIG. 10, when Θ is small, the stepped wafer 5 is convex upward on the α3-β3 line. When Θ is small, the stepped wafer 5 is supported by the central portion in the second direction, and therefore both the front and rear end portions in the second direction are lowered. Therefore, it becomes convex upward on the line along the second direction.

In addition, as shown in FIG. 10, as Θ increases, the degree of downward convex of the stepped wafer 5 on the α3-β3 line increases.

It is desirable to reduce Θ in order to suppress contact between the portion of the wafer hand 22 other than the placement portion 8 and the stepped wafer 5. For example, assuming that the height of the placement portion 8 is 1 mm, when Θ is 110° or less, the contact between the stepped wafer 5 and the wafer hand 22 can be suppressed when the stepped wafer 5 to which the measurement shown in FIG. 10 is performed is held.

More preferably, Θ is 90° or less. Further preferably, Θ is 85° or less. When Θ is 85° or less, the stepped wafer 5 is convex upward on the α3-β3 line as shown in FIG. 10. Therefore, the contact between the portion of the wafer hand 22 other than the placement portion 8 and the stepped wafer 5 is further suppressed. When Θ is small, the stepped wafer 5 is supported by the central portion in the second direction, and therefore both the front and rear end portions in the second direction are lowered. However, because the stepped wafer 5 is placed on the wafer hand 22 such that the joint portion 3 and the stepped wafer 5 do not overlap in a plan view, even when both end portions of the stepped wafer 5 in the second direction are lowered, the stepped wafer 5 does not come into contact with the joint portion 3.

By setting Θ to, for example, 67° or more, the stepped wafer 5 can be stably held.

From the above, Θ is, for example, 67° or more and 110° or less. More preferably, Θ is, for example, 67° or more and 85° or less.

FIG. 11 and FIG. 12 are views corresponding to FIG. 8 and FIG. 9, respectively, and are views showing another example of the present preferred embodiment. FIG. 12 is a cross-sectional view taken along the line α4-β4 in FIG. 11. The wafer hand 22 may be provided with suction holes 10 as shown in FIG. 11 and FIG. 12. An opening of each suction hole 10 is provided on the upper surface of the placement portion 8.

The wafer hand 22 suctions the stepped wafer 5 placed on the placement portion 8 by suction from the opening provided on the upper surface of the placement portion 8. As a result, the drop of the stepped wafer 5 is suppressed. In addition, for example, the wafer hand 22 can be moved at high speed or inverted.

At this time, the region for suctioning the stepped wafer 5 is preferably the rim 15 on the outer peripheral portion of the stepped wafer 5. Because the rim 15 is not ground and is thick, the rim 15 as a portion to be suctioned suppresses the possibility that the stepped wafer 5 is damaged by the suction.

The semiconductor manufacturing apparatus 200 described in the first preferred embodiment may include the wafer hand 22 instead of the wafer hand 21.

C. Third Preferred Embodiment

In the present preferred embodiment, a method for manufacturing a semiconductor device using the wafer hand according to either the first or second preferred embodiment will be described.

C-1. Configuration of Semiconductor Device

FIG. 16 is a diagram showing a semiconductor element 50 which is an example of the semiconductor device manufactured in the present preferred embodiment. The semiconductor element 50 is an IGBT (Insulated Gate Bipolar Transistor).

The semiconductor element 50 includes a collector electrode 64 provided on the back surface side, a p-type collector layer 61 provided on the collector electrode 64, an n-type buffer layer 60 provided on the p-type collector layer 61, an $n^-$ type drift layer 51 provided on the n-type buffer layer 60, a p-type base layer 52 provided on the n type drift layer 51, an $n^+$ type emitter layer 53 provided in a partial region on the p-type base layer 52, a $p^+$ type contact layer 54 provided in the region on the p-type base layer 52 where the $n^+$ type emitter layer 53 is not provided, and an emitter electrode 63 electrically connected to the $n^+$ type emitter layer 53 and the $p^+$ type contact layer 54. Here, $n^+$ type or $p^+$ type indicates that the impurity concentration in the region is higher than the impurity concentration in the n-type or p-type region. The $n^-$ type or $p^-$ type indicates that the impurity concentration in the region is lower than the impurity concentration in the n-type or p-type region.

In the semiconductor element 50, a trench is formed from a surface including the surfaces of the $n^+$ type emitter layer 53 and the $p^+$ type contact layer 54, penetrating the p-type base layer 52, and reaching the $n^-$ type drift layer 51. A trench gate is configured by providing an embedded gate electrode 58 in the trench via a gate insulating film 57. The embedded gate electrode 58 faces the $n^-$ type drift layer 51 with the gate insulating film 57 interposed therebetween. The gate insulating film 57 is in contact with the p-type base layer 52 and the $n^+$ type emitter layer 53. When a gate drive voltage is applied to the embedded gate electrode 58, a channel is formed in the p-type base layer 52 in contact with the gate insulating film 57. An interlayer insulating film 59 is provided between the embedded gate electrode 58 and the emitter electrode 63.

The semiconductor device manufactured by using the wafer hand of the first or second preferred embodiment is not limited to the IGBT, and may be, for example, a MOSFET (Metal Oxide Semiconductor Field Effect Transistor), a diode, or an RC-IGBT (Reverse-Conducting IGBT).

The semiconductor used in the semiconductor device manufactured by using the wafer hand of the first or second preferred embodiment is, for example, any one of a silicon semiconductor, a silicon carbide semiconductor, and a gallium nitride semiconductor.

C-2. Manufacturing Method

FIG. 13 is a flowchart showing a manufacturing method of the semiconductor device of the present preferred embodiment. Hereinafter, the description will be made on the assumption that the semiconductor element 50 is manufactured.

First, a structure on the front surface side of the semiconductor element 50 is formed on the front surface of the semiconductor wafer 4 (step S1).

Next, a front surface protective film is formed on the front surface of the semiconductor wafer 4 (step S2). The front surface protective film protects the structure on the front surface side of the semiconductor element 50 formed in step S1 when the back surface side of the semiconductor wafer 4 is processed in the subsequent steps.

Next, the back surface side of the semiconductor wafer 4 is ground and etched to thin the semiconductor wafer (step S3). In step S3, the back surface is first ground by machining with a grinding wheel. At this time, only the central portion of the back surface of the semiconductor wafer 4 is ground, and the outer peripheral portion of the back surface of the semiconductor wafer 4 is not ground. As a result, the stepped wafer 5 having a rim on the outer peripheral portion is formed. In step S3, the back surface of the stepped wafer 5 is then wet-etched to thin the stepped wafer 5 to an appropriate thickness. In the wet etching, a chemical solution containing, for example, hydrofluoric acid or nitric acid is used.

Next, a structure on the back surface side of the semiconductor element 50 is formed on the back surface side of the stepped wafer 5 (step S4). In step S4, the n-type buffer layer 60 and the p-type collector layer 61 are formed in order by ion injection and heat treatment from the back surface side of the stepped wafer 5, and then the collector electrode 64 is formed on the back surface of the stepped wafer 5.

The wafer hand 21 or the wafer hand 22 of the first or second preferred embodiment is used, for example, in carrying the semiconductor wafer after the semiconductor wafer is thinned in step S3. For example, the stepped wafer 5 obtained by thinning the semiconductor wafer 4 in step S3 is stored into the carrier 6 by the wafer hand 21 or the wafer hand 22 of the first or second preferred embodiment. Because the stepped wafer 5 is thinned, it is held in the carrier 6 in a state of being deflected by its own weight. Even when the stepped wafer 5 is held in the carrier 6 in a deflected state due to its own weight, it is possible to prevent the deflected region of the wafer from coming into contact with the wafer hand and to carry the wafer with the wafer hand of the first or second preferred embodiment. The wafer hand of the first or second preferred embodiment is also used for carrying the wafer to the device for performing steps S4 to S6 and for carrying the wafer from the device for performing steps S4 and S5 into the carrier 6.

The wafer hand 21 or the wafer hand 22 of the first or second preferred embodiment may be used not only after step S3 but also before step S3.

Although how the stepped wafer 5 deflects differs depending on the thickness of the stepped wafer 5, by using the wafer hand 21 or the wafer hand 22 of the first or second preferred embodiment, it is not necessary to adjust the position every time the wafer hand is inserted, and therefore productivity can be improved.

D. Comparative Example

FIG. 14 is a view showing a wafer hand 100 as a comparative example. The wafer hand 100 has a shorter carry portion 2 than the wafer hand of the first or second preferred embodiment. Therefore, when a wafer is placed on the wafer hand 100, the joint portion 3 overlaps with the wafer. Therefore, when the wafer stored in the carrier 6 is taken out, the clearance C is small as shown in FIG. 15, and the wafer hand 100 and the wafer are likely to come into contact with each other.

When the wafer is taken out in the situation shown in FIG. 7, the wafer one level below the wafer to be taken out is also deflected. Therefore, by adjusting the position of the wafer hand 100 to the lower side, there is a possibility that the clearance can be secured between the upper and lower wafers. However, if the insertion position of the wafer hand 100 is adjusted according to the state of the wafer on the lower side, malfunction may occur due to a setting error of the wafer hand insertion position and the like, which may lead to a decrease in production efficiency or wafer damage due to a setting error. According to the wafer hand of the first preferred embodiment or the second preferred embodiment described above, such an inconvenience can be avoided.

Note that it is possible to freely combine the preferred embodiments and to modify or omit each preferred embodiment as appropriate.

While the disclosure has been shown and described in detail, the foregoing description is in all aspects illustrative and not restrictive. It is therefore understood that numerous modifications and variations can be devised.

What is claimed is:

1. A wafer hand comprising:
a first carry portion, a second carry portion, and a joint portion, wherein
the first and second carry portions are arranged in line in a first direction,
the first and second carry portions are connected via the joint portion,
each of the first and second carry portions extends from the joint portion in a second direction orthogonal to the first direction,
an interval between a first inner side surface of the first carry portion and a second inner side surface of the second carry portion, the first and second inner side surfaces facing each other, is 170 mm or more,
an interval between a first outer side surface of the first carry portion and a second outer side surface of the second carry portion, the first and second outer side surfaces facing opposite sides to each other, is 280 mm or less,
a length of the first inner side surface of the first carry portion is greater than a length of the first outer side surface of the first carry portion, and a length of the second inner side surface of the second carry portion is greater than a length of the second outer side surface of the second carry portion,
when a distance between the first inner side surface of the first carry portion and the second inner side surface of the second carry portion is A (mm), and a length of each of the first and second inner side surfaces in the second direction is L (mm), a relationship of $L \geq (300^2 - A^2)^{0.5}$ is satisfied,
a placement portion is provided at a first end portion along the second direction and at a second end portion opposite to the first end portion along the second direction on each of the first carry portion and the second carry portion,
in a plan view,
an angle opening toward the first direction out of angles formed by
a straight line connecting a center of the placement portion at the first end portion of the first carry portion and a center of the placement portion at the second end portion of the second carry portion, and
a straight line connecting a center of the placement portion at the second end portion of the first carry portion and a center of the placement portion at the first end portion of the second carry portion,
is 110° or less,
a guide is provided at a first end portion along the second direction and at a second end portion opposite to the first end portion along the second direction of each of the first carry portion and the second carry portion,
the guide regulates a position in an in-plane direction of a wafer placed on the wafer hand, and
the guide is provided at the placement portion.

2. The wafer hand according to claim 1, wherein the interval between the first and second outer side surfaces is 250 mm or less.

3. The wafer hand according to claim 1, wherein the angle is 67° or more.

4. The wafer hand according to claim 1, wherein a suction hole having a suction opening on an upper surface of the placement portion is provided, and the wafer hand suctions a wafer placed on the upper surface of the placement portion by suction from the suction opening.

5. The wafer hand according to claim 4, wherein the upper surface of the placement portion has a tilt of less than 3°.

6. A semiconductor manufacturing apparatus comprising the wafer hand according to claim 1.

7. A wafer hand comprising:
a first carry portion, a second carry portion, and a joint portion, wherein
the first and second carry portions are arranged in line in a first direction,
the first and second carry portions are connected via the joint portion,
each of the first and second carry portions extends from the joint portion in a second direction orthogonal to the first direction, and
a disk-shaped object to be placed having a diameter d of 295 mm or more can be placed in such a manner as to satisfy two conditions of
(a) the object does not overlap with the first and second carry portions or the joint portion in a plan view in a region other than a region where a distance from a center of the object is 85×(d/300) mm or more and 140×(d/300) mm or less with respect to the first direction, and
(b) in each of two regions where the distance from the center of the object is 85×(d/300) mm or more and 140×(d/300) mm or less with respect to the first direction, one of the first and second carry portions extends along the second direction to a side surface of the object.

8. The wafer hand according to claim 7, wherein the object can be placed in such a manner as to satisfy three conditions of (a), (b), and
(c) a portion of each of the first and second carry portions on the side surface of the object falls within a region where the distance from the center of the object is 85×(d/300) mm or more and 125×(d/300) mm or less with respect to the first direction.

9. The wafer hand according to claim 7, wherein the object can be placed in such a manner as to satisfy, in place of (a) and (b), two conditions of
(d) the object does not overlap with the first and second carry portions or the joint portion in a plan view in a region other than a region where the distance from the center of the object is 85×(d/300) mm or more and 125×(d/300) mm or less with respect to the first direction, and
(e) in each of two regions where the distance from the center of the object is 85×(d/300) mm or more and 125×(d/300) mm or less with respect to the first direction, one of the first and second carry portions extends along the second direction to a side surface of the object.

10. The wafer hand according to claim 7, wherein a placement portion is provided at a first end portion along the second direction and at a second end portion opposite to the first end portion along the second direction on each of the first carry portion and the second carry portion, and
in a plan view,
an angle opening toward the first direction out of angles formed by
a straight line connecting a center of the placement portion at the first end portion of the first carry portion and a center of the placement portion at the second end portion of the second carry portion, and
a straight line connecting a center of the placement portion at the second end portion of the first carry portion and a center of the placement portion at the first end portion of the second carry portion,
is 110° or less.

11. The wafer hand according to claim 10, wherein the angle opening is 67° or more.

12. The wafer hand according to claim 10, wherein a suction hole having a suction opening on an upper surface of the placement portion is provided, and the wafer hand suctions a wafer placed on the upper surface of the placement portion by suction from the suction opening.

13. The wafer hand according to claim 12, wherein the upper surface of the placement portion has a tilt of less than 3°.

14. The wafer hand according to claim 7, wherein a guide is provided at a first end portion along the second direction and at a second end portion opposite to the first end portion along the second direction of each of the first carry portion and the second carry portion, and
the guide regulates a position in an in-plane direction of a wafer placed on the wafer hand.

15. A semiconductor manufacturing apparatus comprising the wafer hand according to claim 7.

16. A method for manufacturing a semiconductor device for carrying a semiconductor wafer using a wafer hand, the method comprising:
a step of preparing the semiconductor wafer having a thickness smaller at a central portion than at an outer peripheral portion,
wherein the semiconductor wafer has a diameter d (mm) of 295 mm or more, and
the wafer hand includes two carry portions extending in a second direction,
the method further comprising a step of placing and carrying the semiconductor wafer on the two carry portions in a state where the semiconductor wafer does not overlap with the wafer hand in plan view in a region other than a region of 85×(d/300) mm or more and 140×(d/300) mm or less from a center of the semiconductor wafer with respect to a first direction orthogonal to the second direction.

17. The wafer hand according to claim 1, wherein a distal end of the first carry portion is curved from the first inner side surface of the first carry portion to the first outer side surface of the first carry portion, and a distal end of the second carry portion is curved from the second inner side surface of the second carry portion to the second outer side surface of the second carry portion.

* * * * *